(12) United States Patent
Boos

(10) Patent No.: US 7,702,032 B2
(45) Date of Patent: Apr. 20, 2010

(54) TRANSMITTER AND METHOD OF TRANSMITTING A SIGNAL

(75) Inventor: Zdravko Boos, Munich (DE)

(73) Assignee: Infineon Technologies AG, Neubiberg (DE)

( * ) Notice: Subject to any disclaimer, the term of this patent is extended or adjusted under 35 U.S.C. 154(b) by 749 days.

(21) Appl. No.: 11/544,319

(22) Filed: Oct. 6, 2006

(65) Prior Publication Data

US 2007/0237256 A1    Oct. 11, 2007

(30) Foreign Application Priority Data

Apr. 10, 2006  (DE) .................. 10 2006 016 761

(51) Int. Cl.
*H04L 27/00* (2006.01)

(52) U.S. Cl. ........................................ 375/295

(58) Field of Classification Search .......... 375/295, 375/296, 297, 298; 455/344
See application file for complete search history.

(56) References Cited

U.S. PATENT DOCUMENTS

| | | | | |
|---|---|---|---|---|
| 5,420,536 A | * | 5/1995 | Faulkner et al. ............ | 330/149 |
| 6,233,438 B1 | * | 5/2001 | Wynn .......................... | 455/126 |
| 6,704,562 B1 | * | 3/2004 | Oberschmidt et al. ........ | 455/344 |
| 2001/0044323 A1 | * | 11/2001 | Waylett ....................... | 455/561 |
| 2002/0044613 A1 | * | 4/2002 | Brankovic et al. ........... | 375/329 |
| 2002/0171476 A1 | * | 11/2002 | Yamamoto ................... | 330/10 |
| 2003/0038675 A1 | * | 2/2003 | Gailus et al. ................. | 330/107 |
| 2003/0109222 A1 | * | 6/2003 | Sun et al. ...................... | 455/24 |
| 2004/0002322 A1 | * | 1/2004 | Krupezevic et al. .......... | 455/323 |

FOREIGN PATENT DOCUMENTS

DE          31120          9/1964
DE       3821181 A1      12/1989

OTHER PUBLICATIONS

Of Hentschel, The Six-Port as a Communications Receiver, IEEE Transactions on Microwave Theory and Techniques, vol. 53, No. 3, Mar. 2005, pp. 1039-1047.*

Tim Hentschel, The Six-Port as a Communication Reciever, IEEE Trans. on Microwave Theory and Technology, Vo. 53, No. 3, Mar. 2005.

* cited by examiner

*Primary Examiner*—Chieh M Fan
*Assistant Examiner*—Jaison Joseph
(74) *Attorney, Agent, or Firm*—SpryIP, LLC

(57) ABSTRACT

A transmitter includes an output. A coupler receives at least a derivative of the output and provides a feedback signal. A demodulator receives the feedback signal and performs an additive mixing to demodulate the feedback signal.

30 Claims, 3 Drawing Sheets

TRANSMITTER AND METHOD OF TRANSMITTING A SIGNAL

BACKGROUND

This application claims priority to German Patent Application No. 10 2006 016 761.9, filed on Apr. 10, 2006.

A transmitter can be used to transmit information using a data signal via a physical transmission channel in a communication system. By way of example, the physical transmission channel may be a cable or, as in the example of a mobile radio system, a radio channel. With the radio channel, the transmission power of the transmitter corresponds to a signal level for the outgoing data signal.

Many mobile radio systems require that the data signals be turned on and off with a high degree of precision. These mobile radio systems include systems such as the Global System for Mobile Communication (GSM), the Universal Mobile Telecommunication System (UMTS), Bluetooth and the Wireless Local Area Network (WLAN). With these systems, specifications for the output power and the permitted spectral transmissions are defined by standards such as the GSM standard, for example, as in 3GPP TS 45.005.

In order to provide a transmitter that can operate in accordance with multiple communication standards and transmit signals using different frequency bands at varying power levels and allowed spectral emissions, the power level at the output of the transmitter must be controlled with a high level of precision. Various approaches have been used to control the power level. One approach is to use a closed power loop wherein the power level at an output of the transmitter is measured and compared to a desired power level to regulate the power level of an outgoing signal.

Another approach is to use a Cartesian loop to perform a demodulation of a sample of the outgoing signal to reconstruct an Inphase signal and a Quadrature signal to control the linearity of the transmission path.

Still another approach is to use a polar loop as a feedback loop in an amplitude path of a polar transmitter to ensure the linearity of an amplitude component of the transmission signal.

These approaches have been used in transmitters for narrow band applications. Because data rates in communication systems have been increasing, wideband transmitter usage is becoming more common. As a result, high linearity and output power are becoming more difficult to achieve.

For these and other reasons, there is a need for the present invention.

BRIEF DESCRIPTION OF THE DRAWINGS

Embodiments of the invention will be explained in detail in the following text with reference to the accompanying drawings.

DETAILED DESCRIPTION

Figure 1:
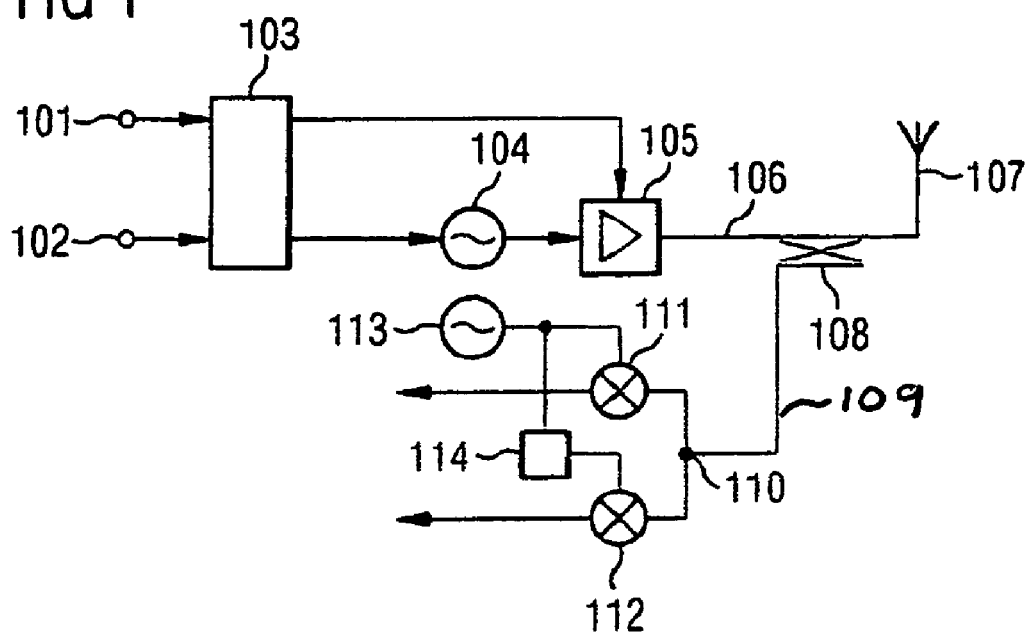
FIG. 1 shows a schematic illustration of one embodiment of a transmitter with a Cartesian feedback path.

In one embodiment a transmitter has an output and includes a coupler. The coupler receives at least a derivative of the output and provides a feedback signal. A demodulator receives the feedback signal, and performs an additive mixing to demodulate the feedback signal.

In one embodiment during additive mixing, the return signal, which corresponds to a radio-frequency signal, is overlaid with a local-frequency signal provided by a local oscillator or by other means. The overlaid signal is supplied to an element with a nonlinear characteristic that includes, but is not limited to, a transistor or a diode. In one embodiment, from the element it is possible to reconstruct a demodulated signal.

In one embodiment, during multiplicative mixing, the incoming return signal is multiplied with a local-frequency signal provided by the local oscillator. In various embodiments, this can be accomplished by using an analoge multiplier or a Gilbert cell.

In various embodiments, the use of additive mixing in the demodulator provides low-complexity demodulation and a simple way of determining the signal level for the output signal. In one embodiment, in contrast to the use of multiplicative mixing in the demodulator, for example such as with a Cartesian demodulator, it is advantageously possible to dispense with analoge multipliers, which have complex designs and typically use a large portion of the surface area on an integrated circuit.

In various embodiments, the demands on an oscillator for demodulation are less than with a Cartesian demodulator.

In one embodiment, the demodulator includes a first adder, to which the return signal and a local frequency signal are supplied, for providing a first overlay signal, and a first nonlinear transmission element, to which the first overlay signal is supplied. The demodulator is designed in a particularly low-complexity implementation for performing additive mixing. The elements mentioned above make the demodulator suitable for establishing a signal level for the return signal.

In one embodiment of the transmitter, the demodulator includes a phase shifter for shifting the local frequency signal by a first phase value, a second adder for providing a second overlay signal, to which the return signal and the local frequency signal shifted by a first phase value are supplied, and a second nonlinear transmission element, to which the second overlay signal is supplied. The demodulator is therefore suitable for producing at least two signals, from which various information can be evaluated, for example, a power parameter or information regarding the linearity in a transmission path of the transmitter.

In one embodiment, the demodulator includes an oscillator for producing the local frequency signal. In this case, the oscillator can produce the local frequency signal in accordance with the needs of the demodulator. The demodulator applies the principle of additive mixing, so that it is not necessary to have a comparable level of stability in a local frequency signal, for example with regard to phase noise, e.g. jitter, as in the case of multiplicative mixing. It is possible to provide a low-complexity oscillator, such as a ring oscillator, in order to produce the frequency signal. Other embodiments of an oscillator or a frequency synthesizer, such as a phase-locked loop or a voltage controlled oscillator, or even quartz oscillator may be applicable as well.

In one embodiment, a modulator includes a second oscillator, and the second oscillator may be coupled to the demodulator for providing the local frequency signal. The modulator is arranged in the transmission path of the transmitter, for example. The second oscillator can be used to produce the modulated output signal. Since it may be coupled to the demodulator, the second oscillator can likewise be used to produce the local frequency signal. It is therefore advantageously possible to turn off the oscillator in the demodulator, or it can be dispensed with completely, which lowers the power consumption of the transmitter, in particular. This embodiment is advantageous for use as a mobile transmitter.

In one embodiment, the demodulator includes an evaluation unit which is coupled to the first nonlinear transmission element and/or to the second nonlinear transmission element. By way of example, this evaluation unit is set up to ascertain a power parameter from the return signal or a reference baseband signal from the return signal. The ascertained values can be used to ensure the linearity for the transmission path, for example by pre-distorting input data on a modulator or setting the output power for the power amplifier.

In one embodiment, the transmitter includes a Cartesian modulator for producing the modulated output signal. In one embodiment, this is a simple implementation of a modulator in a transmitter.

In one embodiment, the transmitter includes a polar modulator for producing the modulated output signal. This may enable data signals to be transmitted with in a broadband communication system.

In one embodiment, the coupling element is set up such that the return signal provided is either the amplified output signal or an output-signal component which is reflected at an output of the transmitter. This allows the feedback path optionally to be used for regulating the linearity in the transmission path or monitoring the impedance at the output of the transmitter. In one embodiment, monitoring of the output impedance is advantageous in order to prevent the power amplifier from malfunctioning. A malfunction can be prevented, by way of example, by matching the impedance of the power amplifier to a change in impedance at the output of the transmitter.

FIG. 1 shows a schematic illustration of one embodiment of a transmitter with a Cartesian feedback path. The transmitter has a first input 101 and a second input 102 to which a data signal to be transmitted is supplied in the form of a Quadrature-modulated baseband signal. In this arrangement, an Inphase signal (I) is provided at the first input 101 and a Quadrature signal (Q) is provided at the second input 102. These signals can be produced, in various embodiments, by baseband-processing devices such as microprocessors.

In the illustrated embodiment, the first input 101 and the second input 102 are respectively connected to a coordinate transformer 103. In the coordinate transformer, the Quadrature-modulated baseband signals are transformed from the Cartesian representation into polar coordinates i.e. into an amplitude information signal and a phase information signal. The coordinate transformer 103 is connected to a phase modulator 104. In this arrangement, the phase modulator 104 is supplied with the phase information signal by the coordinate transformer 103. The phase modulator 104 puts the phase information signal on a carrier frequency. A modulated phase signal accordingly produced by the phase transformer 104 is supplied to a power amplifier 105, to which the output of the phase modulator 104 is connected.

In the illustrated embodiment, the coordinate transformer 103 is connected to the power amplifier 105 and supplies the amplitude information signal to the power amplifier 105. In the power amplifier 105, the amplitude information signal is modulated onto the modulated phase signal to produce a modulated and amplified output signal at an output of the power amplifier 105. The output of the power amplifier 105 is connected to an antenna 107 via an output line 106. The antenna 107 is used to send the output signal to a radio channel. In various embodiments, the transmitter may be used for applications in a wireless communication system, such as a mobile radio system.

In one embodiment, the transmitter corresponds to a polar modulator in which the modulation to the carrier frequency is performed using polar coordinates. Amplitude modulation, as takes place in the case of 8PSK modulation, for example, may be performed by power amplifier 105. In various embodiments, the polar modulator has the advantage that it can be used in broadband transmission systems such as GSM EDGE, UMTS, WLAN, or W-CDMA.

In one embodiment, the output line 106 is electrically coupled to a return line 109 via a coupling element 108. In this embodiment, a portion of the return line 109 is routed in parallel to the output line 106. As a result, the return line 109 includes a parallel section. An end of the parallel section which is oriented toward the antenna 107 may be open or may be provided with a terminating resistance of suitable value such as 50 ohms. The other end of the parallel section is connected to a node 110 via the return line. In this embodiment, the coupling element 108 samples a return signal which corresponds to an attenuated version of the modulated and amplified output signal.

In the illustrated embodiment, the node 110 is respectively connected to a first multiplier 111 and a second multiplier 112 which are supplied with the return signal. The input side of the first multiplier 111 is connected to an output of a local oscillator 113. The local oscillator 113 is connected to the second multiplier 112 via a 90° phase shifter 114. The first multiplier 111 and the second multiplier 112 together form a Cartesian demodulator which may be used to reconstruct an Inphase signal and a Quadrature signal from the output signal. Using the reconstructed signals, the output power of the output signal can be determined. In various embodiments, it is possible to ascertain a distortion between the reconstructed Inphase signal or the reconstructed Quadrature signal and the original Inphase signal (I) or the original Quadrature signal (Q). The pre-distortion may be a parameter for non-linearity in the polar modulator's transmission path. To compensate for the nonlinearity, the Quadrature-modulated baseband signals applied to the first input 101 and the second input 102 may be distorted so that an output signal at the output of the power amplifier is linearly related to the Quadrature-modulated baseband signals at the inputs of the transmitter. The linearity of the transmission path may be influenced by a series of factors, such as temperature, process inaccuracies that arise during the manufacture of the integrated semiconductor component containing the transmitter, the selected frequency band of the communication system, the signal level, aging effects, changes in the power supply for the transmitter, impedance changes or what is known as the voltage standing wave ratio (VSWR), etc. To make suitable allowance for all of these factors, it is possible to provide tables containing appropriate distortion values for different conditions, known as look-up tables (LUTs), for providing distortion coefficients for the Quadrature-modulated baseband signals, for example.

In various embodiments, the transmitter shown in FIG. 1 is based on a polar modulator with a Cartesian feedback path or a Cartesian feedback loop.

Figure 2:
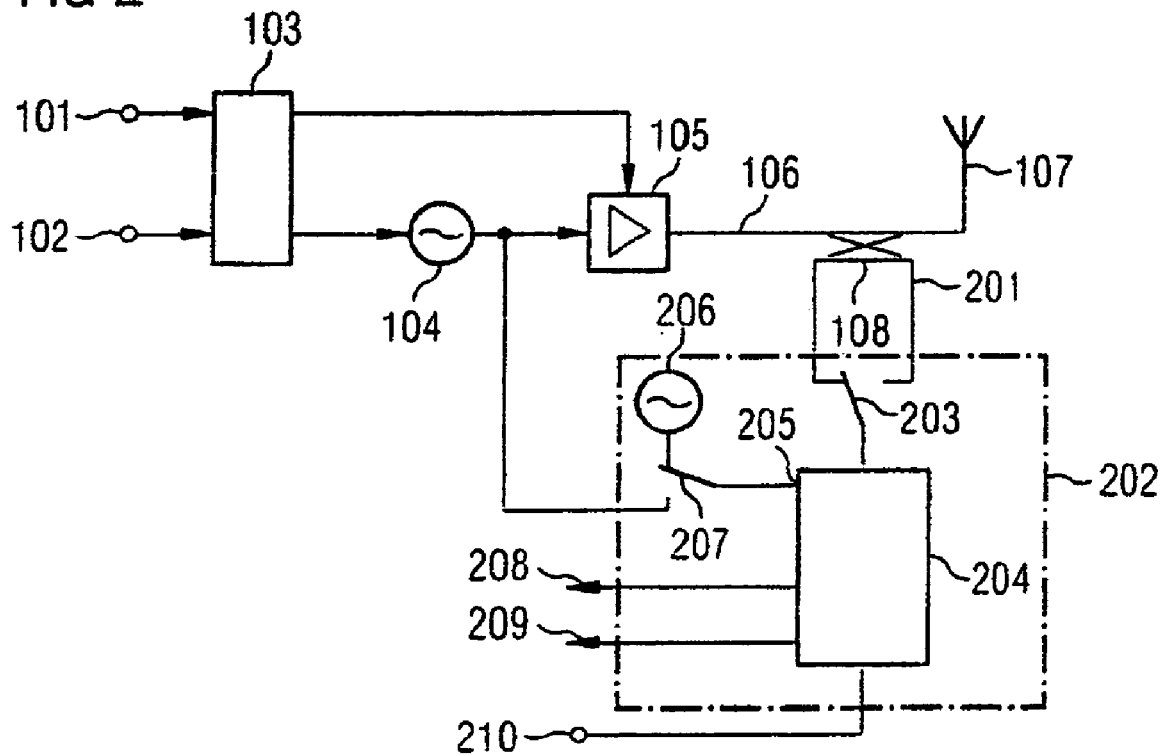
FIG. 2 shows a schematic illustration of one embodiment of a transmitter with a feedback path.

FIG. 2 shows a schematic illustration of one embodiment a transmitter embodiment with a feedback path. The embodiment of the transmitter shown in FIG. 2 differs from that shown in FIG. 1 by virtue of the feedback path. The polar modulator in the transmission path includes the same elements as in FIG. 1. The elements interact likewise as in FIG. 1. For this reason, those elements in FIG. 2 which correspond to those in FIG. 1 have been provided with the same labels and reference symbols.

The return path in this embodiment may be designed as follows. The output line 106 is electrically coupled to a return line 201 via a coupling element 108. To this end, a portion of the return line 201 is routed parallel to the output line 106 in the coupling element 108 such that the return line 201 has a parallel section. In contrast to the return line 109 shown in FIG. 1, the return line 201 has both ends of the parallel section connected to a first switching element 203 in a demodulator 202 (shown in dashes). The output side of the first switching element 203 is connected to a receiver 204. According to a switching state of the first switching element 203, one of the two ends of the parallel section is connected to the receiver 204. The respective free end may have a suitable defined terminating resistance such as 50 ohms, for example. In this embodiment, depending on a switching state of the first switching element 203, the receiver can be supplied either with the output signal from the power amplifier 105 or with an output-signal component which is reflected at the antenna 107.

In the illustrated embodiment, the receiver 204 is designed for additive mixing. The receiver 204 may be in the form of a "six-port junction" receiver or in the form of a "five-port junction" receiver, for example. The receiver 204 has a frequency input 205 which is used to supply it with a local frequency signal. The local frequency signal is used for demodulating an input signal for the receiver 204 from the carrier frequency of the transmitter to baseband. The receiver 204 may include an Inphase output 208 for providing an Inphase component of a reconstructed baseband signal, a Quadrature output 209 for providing a Quadrature component of a reconstructed baseband signal and a power characteristic output 210 for providing a signal level for the return signal.

In the illustrated embodiment, the demodulator 202 includes a local oscillator 206 which can be coupled to the frequency input 205 via a second switching element 207. In addition, the phase modulator 104 may be coupled to the frequency input 205 via the second switching element 207. In some embodiments, in line with the switching state of the second switching element 207, the frequency input 205 may be provided with a local frequency signal from the local oscillator 206 or with a phase-modulated frequency signal from the phase modulator 104 for the purpose of demodulating the input signal for the receiver 204.

In one embodiment, the local oscillator 206 may be in the form of a power-saving ring oscillator. In other embodiments, other apparatuses can be provided to produce a radio-frequency signal, such as a voltage controlled oscillator (VCO) or a phase-locked loop. In one embodiment, the local oscillator 206 has no coil, i.e. it is coil-less. This reduces an overlay for its signal with a signal from an oscillator in the modulator or other oscillators in the transmitter, and the existence of the local oscillator 206 may not result in interference in other frequency generators, e.g. in crosstalk.

In the illustrated embodiment, the receiver 204 takes its input signal and the local frequency signal and reconstructs the Inphase and Quadrature phase components of the output signal in baseband. These may be used to pre-distort input signals for the transmitter at the first input 101 and the second input 102. In addition, the receiver 204 produces information about the signal level at the output of the power amplifier 105. To ascertain these variables, the first switching element 203 may been switched to a first switching state so that the receiver is supplied with the output signal from the power amplifier 105. In the first switching state, the first switching element 203 couples the end of the parallel section of the return line 201 which is closer to the power amplifier 105 to the receiver 204, while the end of the parallel section of the return line 201 which is closer to the antenna may have a suitable defined terminating resistance such as 50 ohms, for example.

In another switching state of the first switching element 203, the end of the parallel section of the return line 201 which is closer to the antenna is coupled to the receiver 204, while that end of the parallel section of the return line 201 which is closer to the power amplifier 105 may have a suitable defined terminating resistance of 50 ohms, for example. In this embodiment, an output signal component reflected by the antenna 107 is thus supplied to the receiver 204. This component changes with the impedance of the antenna 107.

In one embodiment, a change in the impedance of the antenna 107 may be produced by a change in the environment which contains the antenna 107. If the antenna is touched or grasped by a user, the impedance is increased considerably and the reflected component rises. Hence, an increased component of the signal level is likewise reflected. A large reflected component of the signal level can result in the power amplifier being destroyed and is therefore undesirable.

In one embodiment, the receiver 204 ascertains the reflected signal level from the reflected signal component. The reflected signal level is evaluated and, if it exceeds a prescribed threshold value, the amplification power of the power amplifier 105 can be lowered such that the reflected signal level is small enough to prevent the power amplifier 105 from being destroyed.

In some embodiments, the reflected signal level may be monitored periodically. In line with a monitoring method of this kind, the first switching element 203 is switched at particular times such that the reflected component of the output signal is supplied to the receiver 204. Between the times, the output signal is supplied to the receiver 204 in order to monitor, and to be able to regulate accordingly, the linearity of the signal level of the transmission path.

In the illustrated embodiment, the second switching element 207 enables different local frequency signals to be supplied to the receiver 204. In a third switching state, the second switching element 207 is switched such that the local oscillator 206 is connected to the receiver 204. This supplies the receiver 204 with the local frequency signal, produced in the local oscillator 206, for the purpose of demodulating the return signal.

In a fourth switching state, the second switching element 207 may be switched such that the phase modulator 104 is connected to the receiver 204. As a result, the receiver 204 is supplied with the local phase-modulated frequency signal produced in the phase modulator 104 for the purpose of demodulating the return signal. Since this frequency signal has been phase-modulated, it may be used to ascertain a signal level or may not be used to reconstruct a reference baseband signal. In one embodiment, the phase modulator 104 includes an oscillator for producing a frequency signal and for this frequency signal, which may not be phase-modulated, to be supplied to the receiver 204. In this embodiment, it may be possible to reconstruct a reference baseband signal.

In one embodiment, supplying the frequency signal from the phase modulator 104 has the associated advantage that it is possible to interrupt operation of the local oscillator 206 in order to save power during the operation of the transmitter.

Figure 3:
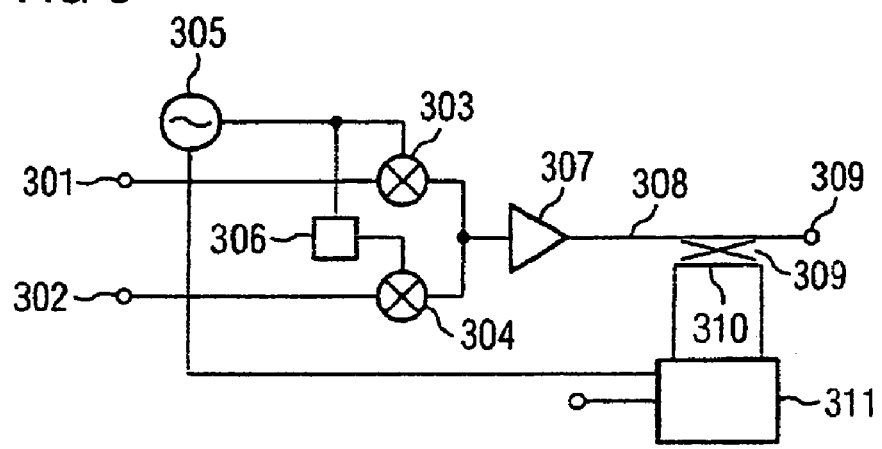
FIG. 3 shows a schematic illustration of one embodiment a transmitter with a feedback path.

FIG. 3 shows a schematic illustration of one embodiment of a transmitter with a feedback path. In this embodiment, the transmitter includes a third input 301 and a fourth input 302 which may be used to supply the data signal for transmission in the form of a Quadrature-modulated baseband signal. In this embodiment, an Inphase signal (I) is provided at the third input 301 and a Quadrature signal is provided at the fourth input 302. These signals may be produced from a baseband-processing device such as a microprocessor.

The third input 301 is connected to a first mixer 303; and the fourth input 302 is connected to a second mixer 304. In addition, the transmitter has a local oscillator 305. The output side of the local oscillator 305 is connected to the third mixer 303 and to a phase shifter 306. Hence, a local frequency signal produced by the local oscillator 305 is supplied to the first mixer 303. The second mixer 304 is supplied with a local frequency signal shifted by a phase, for example by pi/2 or 90°. The first mixer 303 and the second mixer 304 are connected to an input of a power amplifier 307. An output of the power amplifier 307 is connected to a transmission output 309 via an output line 308. The transmission output 309 may be connected to a transmission medium (not shown in FIG. 3). The transmission medium may be, in various embodiments, an antenna or a transmission line, such as a copper wire. Other transmission media are likewise conceivable, e.g. designed for optical transmission using an optical fiber.

The transmitter shown in the FIG. 3 may include a transmission path which uses a Cartesian modulator, i.e. multiplicative mixing. This largely ensures a linear transmission chain.

The output line 308 is electrically coupled to a return line 310 via a coupling element 309. In similar fashion to FIG. 2, a portion of the return line 310 is routed parallel to the output line 308 in the coupling element 309, so that the return line 310 has a parallel section. The return line 310 therefore has both ends of the parallel section connected to a switching element in a demodulator 311. In various embodiments, the demodulator 311 can be designed in the same way as the demodulator shown in FIG. 2, for example. In one embodiment, it is particularly suitable for performing additive mixing.

The local oscillator 305 is likewise connected to the demodulator 311. It is therefore possible to dispense with a separate oscillator in the demodulator 311 for producing a second frequency signal for demodulating the return signal. In various embodiments, this is advantageously possible because the local frequency signal produced by the local oscillator 305 is not phase-modulated.

In the illustrated embodiment, the demodulator 311 takes the demodulated return signal and determines at least one signal level. Depending on how the return line is connected to the demodulator 311, the signal level of an output signal from the transmitter or of a returning reflected signal present at the transmission output is determined as in the embodiment shown in FIG. 2.

The demodulator 211 may be designed in various embodiments, likewise as illustrated in FIG. 2, to provide a reference baseband signal, for example, as a reference Inphase signal and as a reference Quadrature phase signal. However, this may be necessary if high demands have been placed on the linearity of the signal path.

Figure 4:
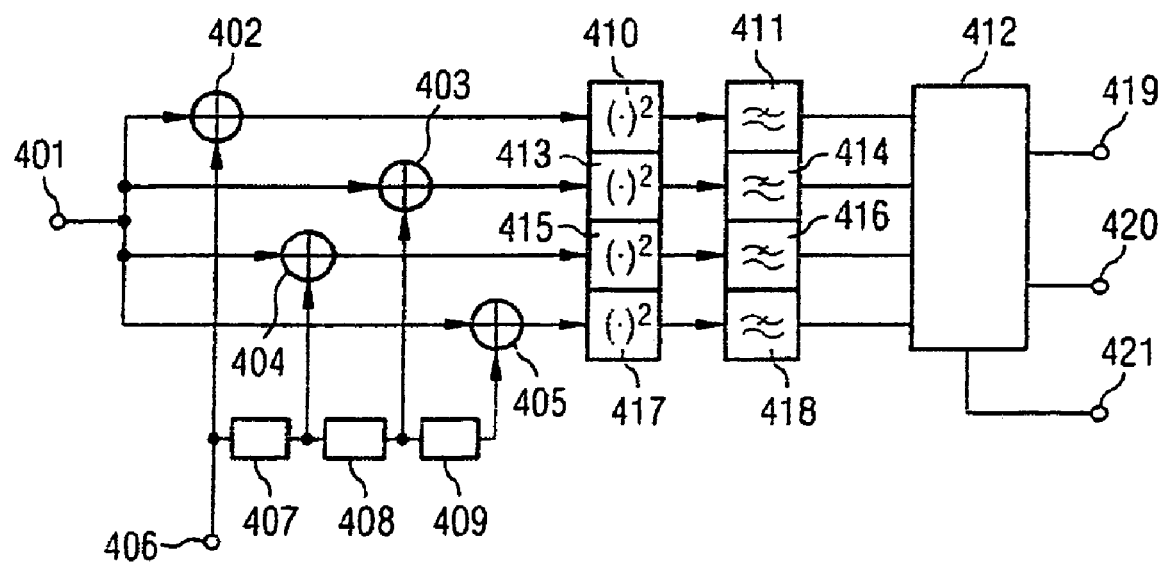
FIG. 4 shows a schematic illustration of one embodiment of a six-port-junction receiver.

FIG. 4 shows a schematic illustration of one embodiment of a six-port junction receiver. The six-port junction receiver includes a first signal input 401 which is connected to a first adder 402, to a second adder 403, to a third adder 404 and to a fourth adder 405 in parallel. The six-port junction receiver also further includes a second signal input 406 which is connected to the first adder 402 and to a first phase shifter 407. The output side of the first phase shifter 407 is connected to the second adder 404 and to a second phase shifter 408. The output side of the second phase shifter 408 is connected to the third adder 404 and to a third phase shifter 409. The output side of the third phase shifter 409 is connected to the fourth adder 405.

In the illustrated embodiment, the output side of the first adder 402 is connected to an evaluation unit 412 via a first nonlinear transmission element 410, for example, such as a diode with a square transmission characteristic, and via a first low-pass filter 411. The output side of the second adder 403 is connected to the evaluation unit 412 via a second nonlinear transmission element 413, for example, a diode with a square transmission characteristic, and via a second low-pass filter 414. The output side of the third adder 404 is connected to the evaluation unit 412 via a third nonlinear transmission element 415, for example, a diode with a square transmission characteristic, and via a third low-pass filter 416. The output side of the fourth adder 405 is connected to the evaluation unit 412 via a fourth nonlinear transmission element 417, for example a diode with a square transmission characteristic, and via a fourth low-pass filter 418. The evaluation unit 412 has an Inphase output 419, a Quadrature phase output 420 and a signal level output 421.

The six-port junction receiver may be arranged as a receiver 204 in the embodiments shown in FIG. 2 and in FIG. 3 respectively. In this arrangement, the first signal input 401 is supplied with the return signal, subsequently called r(t). The second signal input 406 is supplied with the local frequency signal, subsequently called f(t). The return signal r(t) and the local frequency signal f(t) are added in four signal paths—respectively comprising an adder, a nonlinear transmission element and a low-pass filter—and the sum is squared and filtered. The four signal paths differ by virtue of the phase of the local frequency signal f(t). The phase difference is useful for subsequently reconstructing a reference baseband signal or a signal level from the return signal in the evaluation unit 511.

Figure 5:
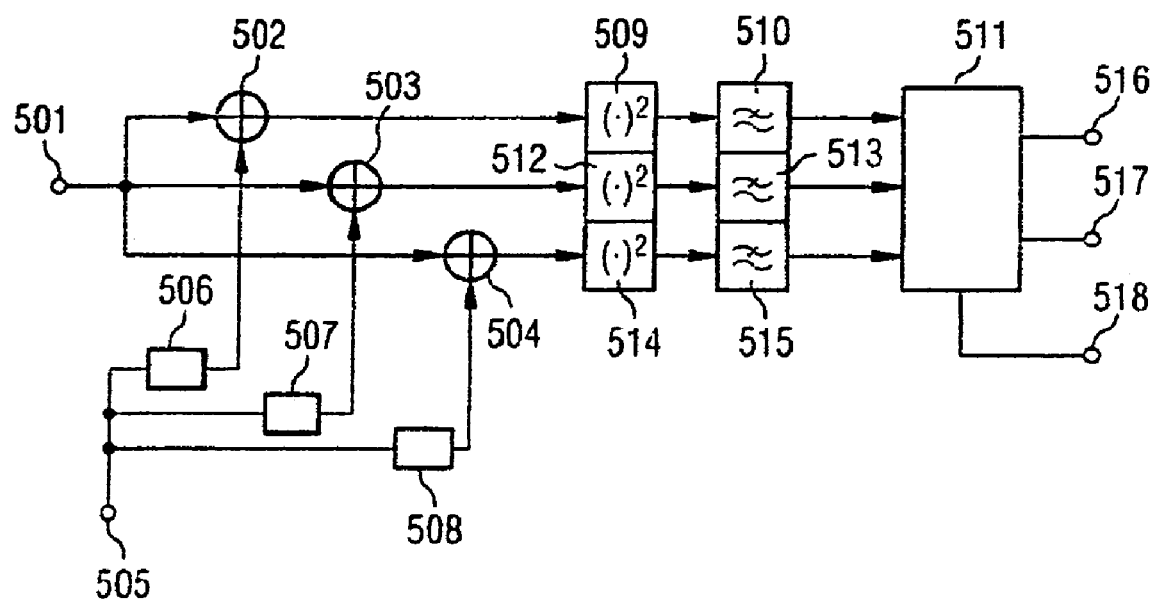
FIG. 5 shows a schematic illustration of one embodiment of a five-port-junction receiver.

FIG. 5 shows a schematic illustration of one embodiment of a five-port junction receiver. The five-port junction receiver includes a third signal input 501 which is connected to a fifth adder 502, to a sixth adder 503 and to a seventh adder 504 in parallel. The five-port junction receiver also further includes a fourth signal input 505 which is connected to a fourth phase shifter 506. The output side of the fourth phase shifter 506 is connected to the fifth adder 502. The fourth signal input 505 is also connected to a fifth phase shifter 507 and to a sixth phase shifter 508. The output side of the fifth phase shifter 507 is connected to the sixth adder 503. The output side of the sixth phase shifter 508 is connected to the seventh adder 504.

The output side of the fifth adder 502 is connected to an evaluation unit 511 via a fifth nonlinear transmission element 509, for example a diode with a square transmission characteristic, and via a fifth low-pass filter 510. The output side of the sixth adder 503 is connected to the evaluation unit 511 via a sixth nonlinear transmission element 512, for example a diode with a square transmission characteristic, and via a sixth low-pass filter 513. The output side of the seventh adder 504 is connected to the evaluation unit 511 via a seventh nonlinear transmission element 514, for example a diode with a square transmission characteristic, and via a seventh low-pass filter 515. The evaluation unit 511 has an Inphase output 516, a Quadrature output 517 and a signal level output 518.

In various embodiments, the five-port junction receiver may be arranged as a receiver 204 in the embodiments shown in FIG. 2 and in FIG. 3. In this case, the third signal input 501 is supplied with the return signal, subsequently called r(t). The fourth signal input 505 is supplied with the local frequency signal, subsequently called f(t). The return signal r(t) and the local frequency signal f(t) are added in three signal paths—respectively comprising an adder, a nonlinear transmission element and a low-pass filter—and the sum is squared and filtered. The three signal paths differ by virtue of the phase of the local frequency signal f(t). The phase difference is useful for subsequently reconstructing a reference baseband signal or a signal level from the return signal in the evaluation unit 511.

What is claimed is:

1. A transmitter having an output, comprising:
    a coupler to receive at least a derivative of the output and provide a feedback signal; and
    a demodulator to receive the feedback signal, and to perform an additive mixing to demodulate the feedback signal, the demodulator having a first switching element and a second switching element, the first switching element coupled to a first end or a second end of a return line associated with the coupler depending on a switching state of the first switching element, and the second switching element coupled to a local oscillator or a phase modulator depending on a switching state of the second switching element.

2. A transmitter according to claim 1, the demodulator comprising:
    a first adder calculating a first signal based on the feedback signal and a frequency signal; and
    a non-linear element providing a second signal based on a non-linear relation of the first signal.

3. A transmitter according to claim 2, the demodulator further comprising:
    a phase shifter that shifts a phase of the frequency signal.

4. A transmitter according to claim 3, the demodulator further comprising:
    a second adder that calculates a third signal based on the feedback signal and the phase-shifted frequency signal.

5. A transmitter according to claim 4, the demodulator further comprising:
    a second non-linear element that provides a fourth signal based on a non-linear relation of the third signal.

6. A transmitter according to claim 1, wherein the coupler is configured to receive a reflection signal or a derivative thereof as feedback signal.

7. A transmitter according to claim 6, wherein the reflection signal is provided by a transmission medium.

8. A transmitter according to claim 7, wherein the transmission medium is an antenna.

9. A transmitter according to claim 7, wherein the transmission medium is a transmission line.

10. A transmitter according to claim 1 further comprising an evaluation apparatus connected to the demodulator.

11. A transmitter according to claim 10, wherein the evaluation apparatus is configured to calculate power level information based on a transmission signal provided at the output.

12. A transmitter according to claim 10, wherein the evaluation apparatus is configured to calculate power level information based on reflection signal.

13. A transmitter according to claim 1, further comprising an amplifier connected to the output to provide a transmission signal at the output.

14. A transmitter according to claim 1, further comprising a modulator that modulates a data signal into a transmission signal, wherein the modulator is connected to the output to provide the transmission signal at the output.

15. A transmitter according to claim 10, wherein the evaluation apparatus is configured to demodulate the feedback signal into a reference data signal.

16. A transmitter according to claim 15, wherein the evaluation apparatus is configured to compare the reference data signal to a data signal.

17. A transmitter according to claim 14, wherein the modulator comprises an oscillator connected to the demodulator, wherein the oscillator provides a frequency signal.

18. An apparatus for controlling an output signal of a transmitter, comprising:
    a demodulator that performs an additive mixing, the demodulator having a first switching element and a second switching element, the first switching element coupled to a first end or a second end of a return line depending on a switching state of the first switching element, and the second switching element coupled to a local oscillator or a phase modulator depending on a switching state of the second switching element.

19. An apparatus according to claim 18, wherein the demodulator is a six-port-junction receiver.

20. An apparatus according to claim 18, wherein the demodulator is a five-port-junction receiver.

21. An apparatus according to claim 18, further comprising a regulation apparatus connected to the demodulator.

22. An apparatus according to claim 21, wherein the regulation apparatus is configured to regulate a power level of the output signal.

23. An apparatus according to claim 21, wherein the regulation apparatus is configured to monitor a power level of a reflection signal provided at an output of the transmitter by a transmission medium connected to the output.

24. An apparatus according to claim 21, wherein the regulation apparatus is configured to control a linearity of a transmit path of the transmitter.

25. Method for controlling a transmitter comprising:
    sampling a feedback signal at an output of the transmitter; and
    demodulating the feedback signal using an additive mixing, the demodulating including:
        in a first switching state, demodulating the feedback signal aided by a local frequency signal, and
        in a second switching state. demodulating the feedback signal aided by a phase-modulated frequency signal.

26. Method according to claim 25, further comprising:
    calculating power level information based on the feedback signal.

27. Method according to claim 25, wherein the feedback signal is derived from a transmission signal provided at an output of the transmitter.

28. Method according to claim 25, wherein the feedback signal is derived from a reflection signal provided at an output of the transmitter by a transmission medium connected to the output.

29. Method according to claim 25, comprising:
    regulating an output power of the transmitter in dependency of the power level information.

30. Method according to claim 25, further comprising regulating a linearity of a transmit path of the transmitter based on the feedback signal.

* * * * *